United States Patent
Pi

(10) Patent No.: US 12,148,679 B2
(45) Date of Patent: Nov. 19, 2024

(54) SEMICONDUCTOR DEVICE INCLUDING AN EXPOSED SOLDERABLE ELEMENT

(71) Applicant: Advanced Semiconductor Engineering, Inc., Kaohsiung (TW)

(72) Inventor: Tun-Ching Pi, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 588 days.

(21) Appl. No.: 17/169,230

(22) Filed: Feb. 5, 2021

(65) Prior Publication Data
US 2022/0254699 A1    Aug. 11, 2022

(51) Int. Cl.
*H01L 23/36* (2006.01)
*H01L 23/00* (2006.01)
*H01L 23/31* (2006.01)

(52) U.S. Cl.
CPC ............... *H01L 23/36* (2013.01); *H01L 23/31* (2013.01); *H01L 24/03* (2013.01); *H01L 24/06* (2013.01)

(58) Field of Classification Search
CPC ......... H01L 23/36; H01L 23/31; H01L 24/03; H01L 24/06; H01L 23/49816; H01L 23/49822; H01L 24/11; H01L 24/13; H01L 24/05; H01L 23/3128; H01L 25/03; H01L 25/50; H01L 2224/0401; H01L 2224/05568; H01L 2224/1132; H01L 2225/06586
See application file for complete search history.

(56) References Cited

U.S. PATENT DOCUMENTS

| | | | | |
|---|---|---|---|---|
| 6,442,033 B1* | 8/2002 | Liu | ............... | H01L 23/5385 361/743 |
| 10,453,802 B2 | 10/2019 | Hu | | |
| 2011/0156228 A1* | 6/2011 | Kobayashi | ......... | H01L 23/3677 257/676 |
| 2019/0067207 A1* | 2/2019 | Hu | ............ | H01L 21/4871 |
| 2019/0232437 A1* | 8/2019 | Joshi | ............... | B23K 35/025 |

(Continued)

FOREIGN PATENT DOCUMENTS

JP    2003-007910 A    1/2003

OTHER PUBLICATIONS

Choi, Jinseok et al. "Reliable low-temperature die attach process using Ag/Sn/Ag sandwich structure for high-temperature semiconductor devices." Scientific Reports vol. 9,1 555. Jan. 24, 2019, doi: 10.1038/s41598-018-37103-7 (Year: 2019).*

(Continued)

*Primary Examiner* — Benjamin P Sandvik
*Assistant Examiner* — John Patrick Cornely
(74) *Attorney, Agent, or Firm* — FOLEY & LARDNER LLP

(57) ABSTRACT

A semiconductor device, a semiconductor package, and a method of manufacturing the same are provided. The semiconductor device includes an electronic component, a first thermal conductive layer, a second thermal conductive layer, and a solderable element. The first thermal conductive layer is disposed adjacent to a surface of the electronic component. The second thermal conductive layer is disposed on the first thermal conductive layer and exposes a portion of the first thermal conductive layer. The solderable element is disposed on the second thermal conductive layer.

10 Claims, 19 Drawing Sheets

(56) References Cited

U.S. PATENT DOCUMENTS

2019/0393126 A1* 12/2019 Yen .................... H01L 23/3128

OTHER PUBLICATIONS

S. K. Kang et al., "Development of conductive adhesive materials for via fill applications," 2000 Proceedings. 50th Electronic Components and Technology Conference (Cat. No.00CH37070), Las Vegas, NV, USA, 2000, pp. 887-891, doi: 10.1109/ECTC.2000. 853269. (Year: 2000).*

Manabu Tsujimura, "The way to zeros: The future of semiconductor device and chemical mechanical polishing technologies," Japanese Journal of Applied Physics, vol. 55, No. 653, pp. 06JA01-1-06JA01-6 (May 2016). (Year: 2016).*

* cited by examiner

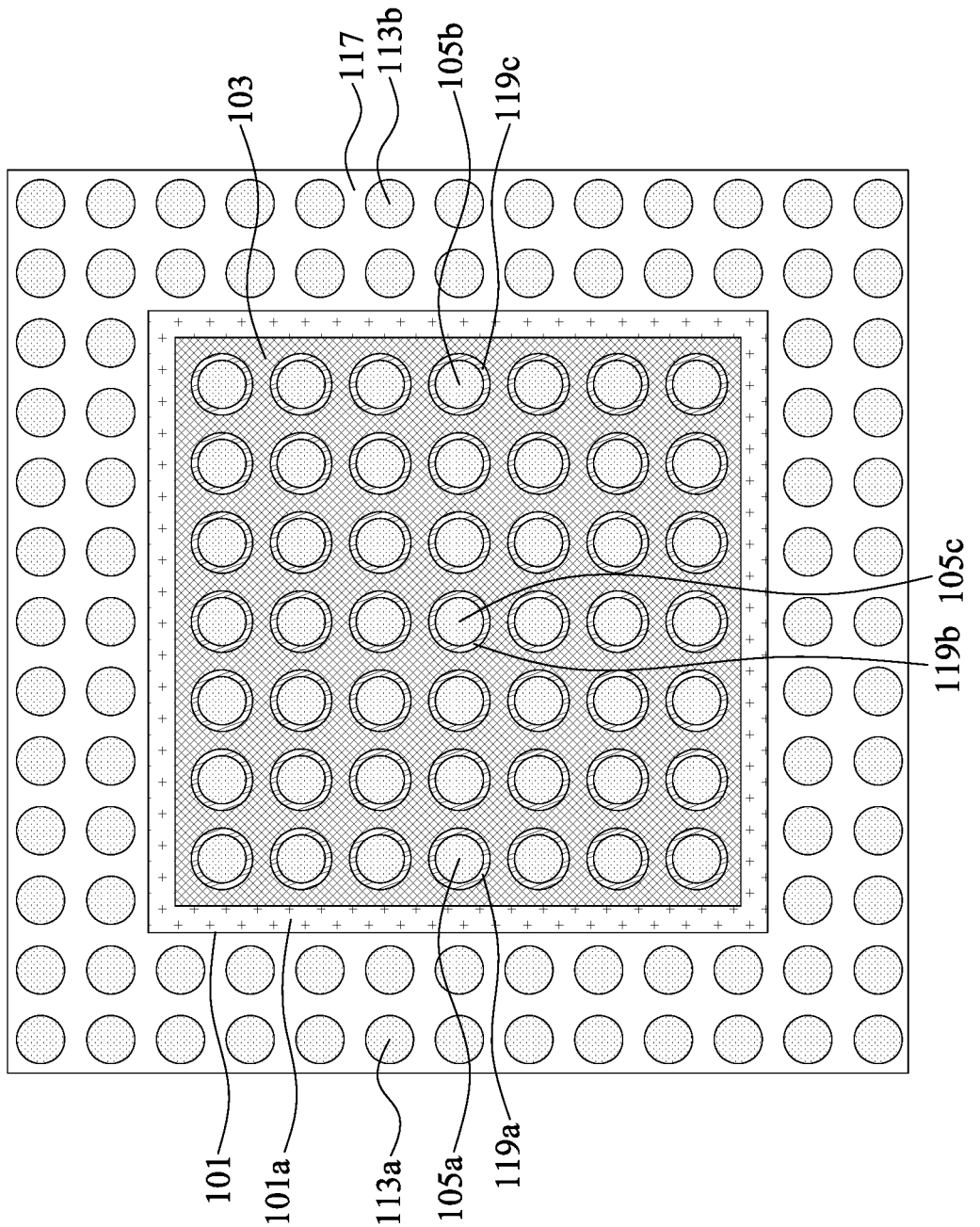

SEMICONDUCTOR DEVICE INCLUDING AN EXPOSED SOLDERABLE ELEMENT

BACKGROUND

1. Technical Field

The present disclosure relates to a semiconductor device, a semiconductor package, and a method of manufacturing the same, and more particularly, to a semiconductor device, a semiconductor package, and a method of manufacturing the same that can improve heat dissipation effect.

2. Description of the Related Art

It has become common to incorporate multiple semiconductor components into a single semiconductor package to provide more functions. As the number of semiconductor components in a single semiconductor package increases, however, more heat is generated, which may accumulate if not dissipated in an appropriate manner and adversely affect the performance of the semiconductor components. Therefore, it would be desirable to provide semiconductor devices with better heat dissipation to alleviate the problem of heat accumulation.

SUMMARY

In an aspect, a semiconductor device includes an electronic component, a first thermal conductive layer, a second thermal conductive layer, and a solderable element. The first thermal conductive layer is disposed adjacent to a surface of the electronic component. The second thermal conductive layer is disposed on the first thermal conductive layer and exposes a portion of the first thermal conductive layer. The solderable element is disposed on the second thermal conductive layer.

In an aspect, a semiconductor package includes a substrate, a first electronic component, a second electronic component, a first thermal conductive layer, a second thermal conductive layer, and a solderable element. The first electronic component is disposed on a first surface of the substrate. The second electronic component is disposed on a second surface of the substrate. The first thermal conductive layer is disposed on an exposed surface of the first electronic component. The second thermal conductive layer is disposed on the first thermal conductive layer and includes a plurality of parts separated from each other. The solderable element is disposed on the second thermal conductive layer.

In an aspect, a method of manufacturing a semiconductor device includes: forming a conductive layer on a surface of an electronic component; and forming a conductive material including conductive particles on a predetermined portion of the conductive layer.

BRIEF DESCRIPTION OF THE DRAWINGS

FIG. 2(b) illustrates a bottom view of the semiconductor package illustrated in FIG. 2(a) according to some embodiments of the present disclosure.

FIG. 5A, FIG. 5B, FIG. 5C, FIG. 5D, FIG. 5E, FIG. 5F, FIG. 5G, FIG. 5H, FIG. 5I, FIG. 5J, and FIG. 5K illustrate a method for manufacturing a semiconductor package such as the semiconductor package of FIG. 4.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

It has become common to incorporate multiple semiconductor components into a single semiconductor package to provide more functions. As the number of semiconductor components in a single semiconductor package increases, however, more heat is generated, which may accumulate if not dissipated in an appropriate manner and adversely affect the performance of the semiconductor components. Therefore, how to dissipate heat generated from such components (particularly from a high power electronic component, e.g., from a die) effectively becomes an issue. Given the above and other reasons, it would be desirable to provide semiconductor packages with better heat dissipation to alleviate the problem of heat accumulation.

In some embodiments, the present disclosure provides a semiconductor package including a semiconductor device including an electronic component, a first thermal conductive layer, a second thermal conductive layer, and a solderable element. The first thermal conductive layer is disposed adjacent to a surface of the electronic component. The second thermal conductive layer is disposed on the first thermal conductive layer and exposes a portion of the first thermal conductive layer. The solderable element is disposed on the second thermal conductive layer so heat generated from the electronic component may transfer from the first thermal conductive layer through the solderable element to an external environment (e.g., a substrate).

Figure 1A:
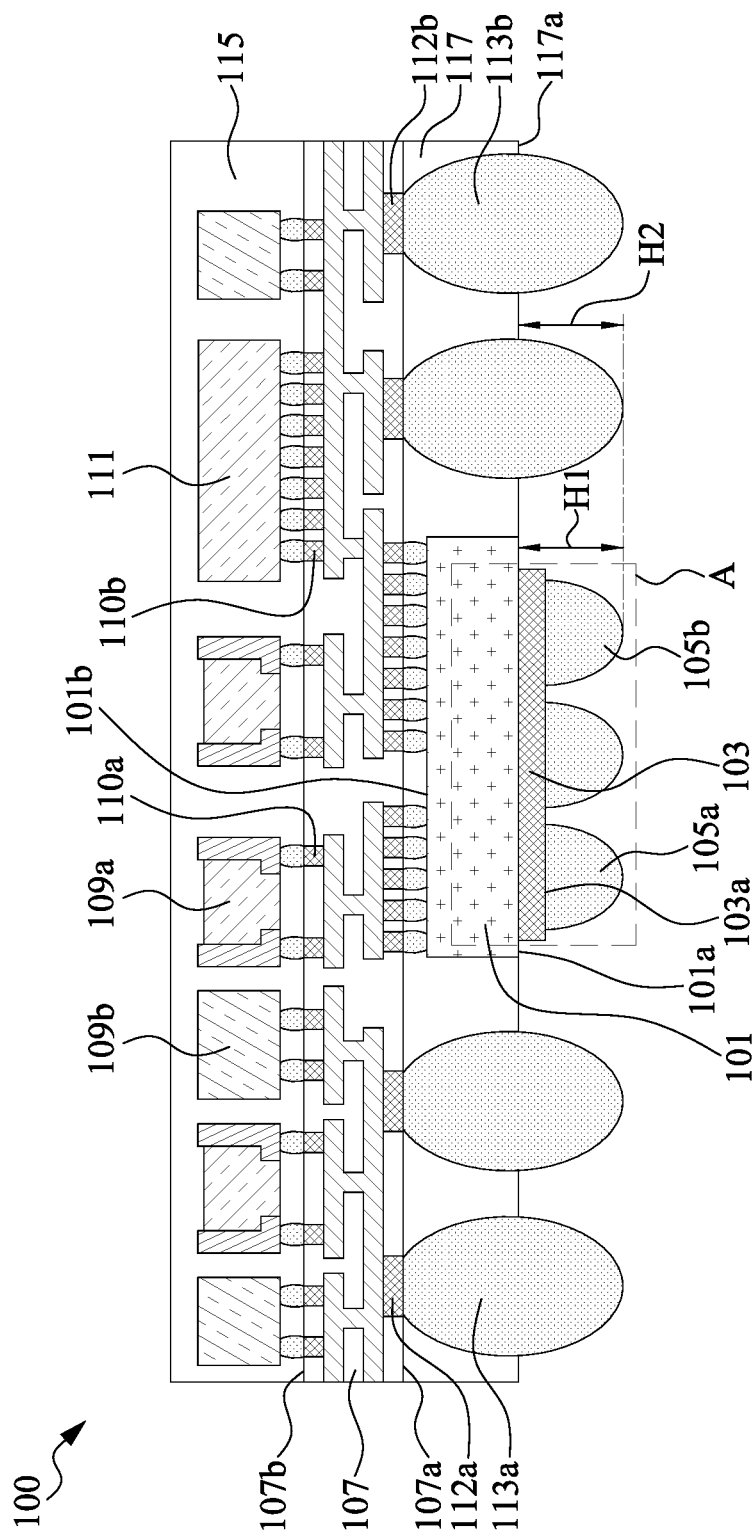
FIG. 1(a) illustrates a cross-sectional view of a semiconductor package according to some embodiments of the present disclosure.

FIG. 1(a) illustrates a cross-sectional view of a semiconductor package 100 according to some embodiments of the present disclosure. The semiconductor package 100 of FIG. 1 includes a semiconductor device including a first electronic component 101, a first thermal conductive layer 103 and a second thermal conductive layer 105a, 105b.

The first electronic component 101 has a first surface 101a and a second surface 101b opposite to the first surface 101a. The second surface 101b may be an active surface of the first electronic component 101. The first electronic component 101 may include an active component (e.g., a die or a chip) and a passive component (e.g., a capacitor, an inductor, or a resistor). In some embodiments, the first electronic component 101 includes a die.

The first thermal conductive layer 103 is thermally coupled to an inactive surface (e.g., the first surface 101a) of the first electronic component 101. The first thermal conductive layer 103 may be disposed adjacent to the first surface 101a of the first electronic component 101. The first thermal conductive layer 103 may be disposed directly on (e.g., physical contact) the first surface 101a of the first electronic component 101. The first thermal conductive layer 103 may be disposed indirectly on the first surface 101a of the first electronic component 101 with a connecting element disposed therebetween. The first thermal conductive layer 103 may include a thermal conductive material including, for example, copper. The first thermal conductive layer 103 may include thermal conductive particles including, for example, copper. The first thermal conductive layer 103 may include thermal conductive particles and an adhesive material. In some embodiments, the first thermal conductive layer 103 includes a thermal conductive paste including, for example, a copper paste or a solder paste. In some embodiments, the first thermal conductive layer 103 includes copper particles and resin. In some embodiments where the first thermal conductive layer 103 includes a thermal conductive paste (e.g., a copper paste), the first thermal conductive layer 103 may be formed on the first surface 101a of the first electronic component 101 in a more process and cost effective manner by a printing technique as compared to one formed by a sputtering technique because the sputtering technique would require more processes in order to form a layer on a selected region and more time for obtaining a desired thickness of the layer, which would cost more.

In addition, since a first thermal conductive layer 103 including a thermal conductive paste (e.g., a copper paste) may be formed on the first surface 101a of the first electronic component 101 by a printing technique, a layer formed by such manner is also advantageous compared to one formed by a plating technique as the plating technique needs to immerse the first electronic component 101 into an strong acid solution for a certain period of time, which may damage the first electronic component 101 and affect its performance. In addition, the use of the strong acid solution is not environmental friendly.

The second thermal conductive layer 105a, 105b is thermally coupled to the first thermal conductive layer 103. The second thermal conductive layer 105a, 105b may be disposed adjacent to a surface 103a of the first thermal conductive layer 103. The second thermal conductive layer 105a, 105b may be disposed directly on (e.g., physical contact) the surface 103a of the first thermal conductive layer 103. The second thermal conductive layer 105a, 105b may be disposed indirectly on the surface 103a of the first thermal conductive layer 103 with a connecting element disposed therebetween. In some embodiments, the second thermal conductive layer 105a, 105b is disposed on (e.g., physical contact) the surface 103a of the first thermal conductive layer 103 and exposes a portion of the surface 103a of the first thermal conductive layer 103. A surface area or a projection area on the first surface 101a of the first electronic component 101 of the second thermal conductive layer 105a, 105b may be less than that of the first thermal conductive layer 103 so the first thermal conductive layer 103 may accommodate one or more of the second thermal conductive layer 105a, 105b.

By disposing the first thermal conductive layer 103 with a larger surface area, for example, a surface area that may accommodate more than one of the second thermal conductive layers 105a, 105b, the heat dissipation effect of the first thermal conductive layer 103 may be improved as the surface area for heat dissipation is enlarged. In addition, by disposing the second thermal conductive layer 105a, 105b as having less surface area than the first thermal conductive layer 103, manufacturing cost may be reduced as compared to forming a single thermal conductive layer 103 to have the same height as the sum of that of the first thermal conductive layer 103 and that of the second thermal conductive layer 105a, 105b (H1).

The second thermal conductive layer 105a, 105b may include a thermal conductive material, for example, copper or solder. The second thermal conductive layer 105a, 105b may include thermal conductive particles, including, for example, copper or solder. The second thermal conductive layer 105a, 105b may include thermal conductive particles and an adhesive material. The second thermal conductive layer 105a, 105b may include, for example, a solderable element. In some embodiments, the solderable element includes a solder paste, which may become a solder ball after a reflowing process.

In some embodiments where the second thermal conductive layer 105a, 105b includes a solderable element, it may help to reduce connection failure of an electrical connector 113a, 113b caused by the size deviation resulted from its manufacturing process. For example, if the electrical connector 113a, 113b is formed smaller than the required size and a gap exists between the electrical connector 113a, 113b and a substrate to be connected, the second thermal conductive layer 105a, 105b may help the electrical connector 113a, 113b to connect to the substrate by its adhesion effect to the substrate provided by reflowing it. On the other hand, if the electrical connector 113a, 113b is formed oversized, a distance between the package 100 and a substrate to be connected becomes farther and a gap exists between the second thermal conductive layer 105a, 105b and the substrate, such gap may also be filled by its adhesion effect to the substrate provided by reflowing it. Thus, the process window for forming the electrical connector 113a, 113b may be increased.

The second thermal conductive layer may include a plurality of parts 105a, 105b separated from each other or is formed as a whole. Each of the parts 105a, 105b of the second thermal conductive layer 105a, 105b may be thermally coupled to the first thermal conductive layer 103 as long as an overall surface area of the parts 105a, 105b of the second thermal conductive layers 105a, 105b is less than that of the first thermal conductive layer 103. In some embodiments where the second thermal conductive layer 105a, 105b is formed as a whole, it may be disposed as having, for example, a substantially circular, ring, rectangular, square, triangle, oval, and polygon shape. In some embodiments where the second thermal conductive layer 105a, 105b includes a plurality of parts 105a, 105b separated from each other, each part 105a, 105b of the second thermal conductive layer 105a, 105b may be disposed as having, for example, a substantially circular, ring, rectangular, square, triangle, oval, and polygon shape and the parts 105a, 105b of the second thermal conductive layer 105a, 105b may be arranged in random, matrix, or in a substantially circular, ring, rectangular, square, triangle, oval, and polygon shape.

In some embodiments, the semiconductor package 100 may further include a first substrate 107. The first substrate 107 has a first surface 107a and a second surface 107b opposite to the first surface 107a. The first substrate 107 may include at least one conductive layer and at least one dielectric layer that transmit signal from the first surface 107a of the first substrate 107 to the second surface 107b of the first substrate 107. The first substrate 107 may be a carrier and an interposer.

The first electronic component 101 may be further disposed adjacent to the first substrate 107. The first electronic component 101 may be disposed adjacent to the first surface 107a of the first substrate 107. The first electronic component 101 may electrically connect to the first surface 107a of the first substrate 107.

In some embodiments, the semiconductor package 100 may further include a first encapsulant 117.

The first encapsulant 117 may be disposed adjacent to the first surface 107a of the first substrate 107. The first encapsulant 117 may be disposed on (e.g., physical contact) the first surface 107a of the first substrate 107. The first encapsulant 117 may cover the first electronic component 101. In some embodiments, the first encapsulant 117 surrounds the first electronic component 101 with the first surface 101a of the first electronic component 101 exposed from a surface 117a of the first encapsulant 117. In some embodiments, the first encapsulant 117 embeds the first electronic component 101 with only the first surface 101a of the first electronic component 101 exposed from the surface 117a of the first encapsulant 117. The first encapsulant 117 may be, for example, a solder mask (the material of which is, for example, polyimide (PI)), a passivation layer (the material of which is, for example, a metal oxide), or an underfill. The first encapsulant 117 may include fillers, the material of which is, for example, silica and/or carbon for reducing stress on the substrate and warpage of a resulting semiconductor package.

In some embodiments, the semiconductor package 100 may further include at least one electrical connector 113a, 113b.

The electrical connector 113a, 113b may be disposed adjacent to the first surface 107a of the first substrate 107. The electrical connector 113a, 113b may electrically connect to the first surface 107a of the first substrate 107. In some embodiments, the electrical connector 113a, 113b electrically connects to the first surface 107a of the first substrate 107 via an electrical contact 112a, 112b disposed adjacent to the first surface 107a of the first substrate 107. The electrical contact 112a, 112b may be disposed on (e.g., physical contact or embedded in and exposed by) the first surface 107a of the first substrate 107. The electrical contact 112a, 112b may be, for example, a contact pad of a trace or a ball pad. In some embodiments, the electrical contact 112a, 112b is a ball pad.

In some embodiments, a portion of the electrical connector 113a, 113b is exposed from the surface 117a of the first encapsulant 117 for external connection. In some embodiments, a first height H1 measuring from the surface 117a of the first encapsulant 117 to an end of the second thermal conductive layer 105a, 105b (e.g., the thickness of the first thermal conductive layer 103+the thickness of the second thermal conductive layer 105a, 105b) may be substantially the same as a second height H2 measuring from the surface 117a of the first encapsulant 117 to an end of the electrical connector 113a, 113b.

As described in the previous paragraph, connection failure of the electrical connector 113a, 113b caused by the size deviation resulted from its manufacturing process may be reduced by utilizing a solderable element as the second thermal conductive layer 105a, 105b. In addition, such effects may be further enhanced if the second thermal conductive layer 105a, 105b is so disposed that the first height H1 of the second thermal conductive layer 105a, 105b and the first thermal conductive layer 103 is substantially the same as the second height H2 after reflow.

In some embodiments, the semiconductor package 100 may further include at least one second electronic component 109a, 109b, 111. The second electronic component 109a, 109b, 111 may be disposed adjacent to the second surface 107b of the first substrate 107. The second electronic component 109a, 109b, 111 may electrically connect to the second surface 107b of the first substrate 107 by electrical contact 110a, 110b disposed on (e.g., physical contact or embedded in and exposed by) the second surface 107b of the first substrate 107. The second electronic component 109a, 109b, 111 may be an active component 111 (e.g., a die or a chip) and a passive component 109a, 109b (e.g., a capacitor, an inductor, or a resistor).

In some embodiments, the semiconductor package 100 may further include a second encapsulant 115.

The second encapsulant 115 may be disposed adjacent to the second surface 107b of the first substrate 107. The second encapsulant 115 may be disposed on (e.g., physical contact) the second surface 107b of the first substrate 107. The second encapsulant 115 may cover the second electronic component 109a, 109b, 111. In some embodiments, the second encapsulant 115 surrounds the second electronic component 109a, 109b, 111. In some embodiments, the second encapsulant 115 encapsulates the second electronic component 109a, 109b, 111. The second encapsulant 115 may be, for example, a solder mask (the material of which is, for example, polyimide (PI)), a passivation layer (the material of which is, for example, a metal oxide), or an underfill. The second encapsulant 115 may include fillers, the material of which is, for example, silica and/or carbon for reducing stress on the substrate and warpage of a resulting semiconductor package.

Figure 1B:
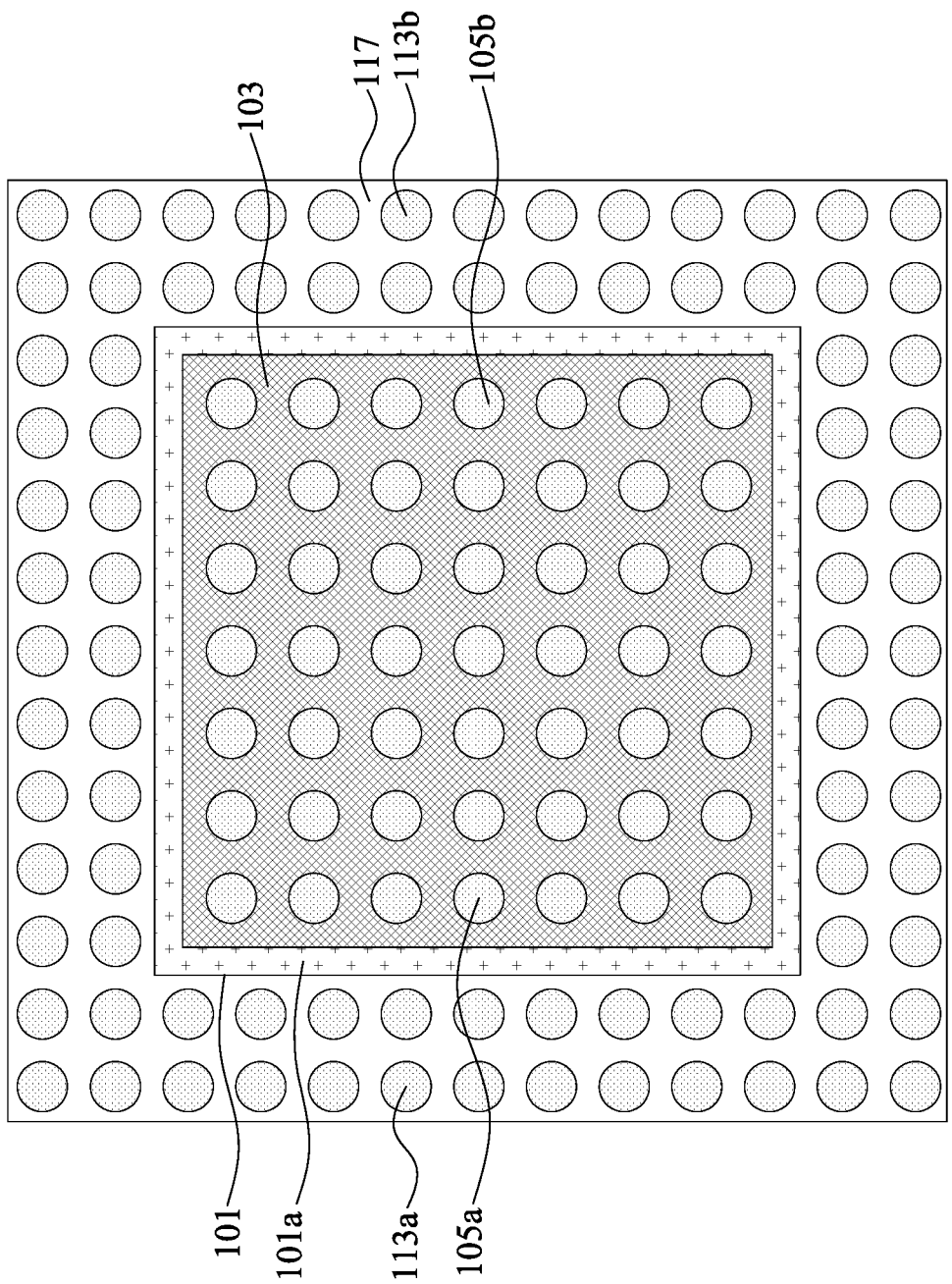
FIG. 1(b) illustrates a bottom view of the semiconductor package illustrated in FIG. 1(a) according to some embodiments of the present disclosure.

FIG. 1(b) illustrates a bottom view of the semiconductor package 100 illustrated in FIG. 1(a) according to some embodiments of the present disclosure. The first thermal conductive layer 103 may cover at least a portion of the first surface 101a of the first electronic component 101. The first thermal conductive layer 103 may cover the entire first surface 101a of the first electronic component 101. A surface area or a projection area on the first surface 101a of the first electronic component 101 of the first thermal conductive layer 103 may be smaller than that of the first surface 101a of the first electronic component 101. In some embodiments, the second thermal conductive layer 105a, 105b includes a plurality of parts 105a, 105b disposed adjacent to the first thermal conductive layer 103, each of the plurality of the parts 105a, 105b has a substantially circular shape, and the plurality of the parts 105a, 105b may be arranged in matrix, or in a substantially square type. In some embodiments, the plurality of the parts 105a, 105b of the second thermal conductive layer 105a, 105b may be surround by the electrical connectors 113a, 113b.

Figure 1C:
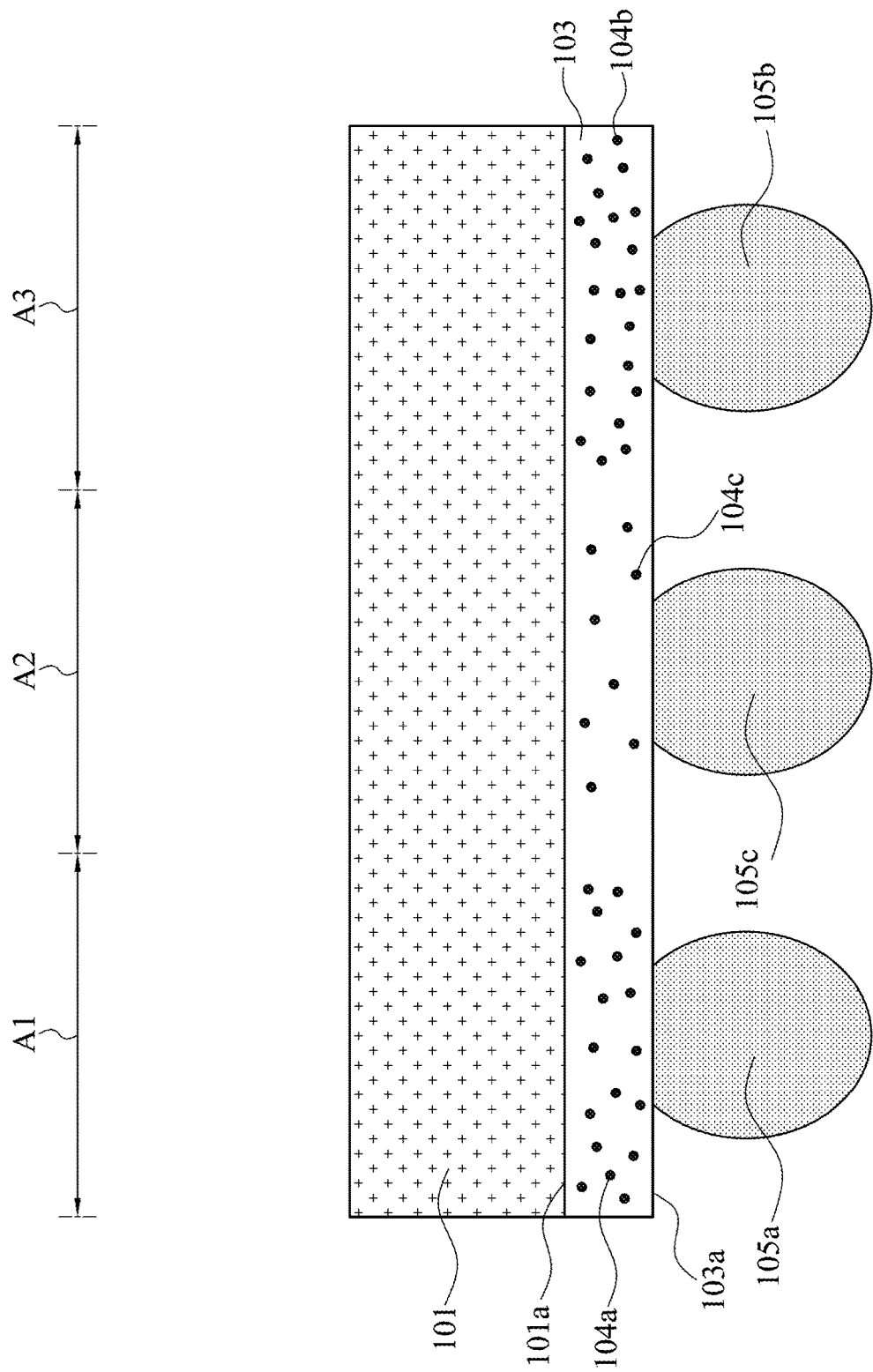
FIG. 1(c) illustrates an enlarged view of a region A of the semiconductor package illustrated in FIG. 1(a) according to some embodiments of the present disclosure.

FIG. 1(c) illustrates an enlarged view of a region A of the semiconductor device 100 illustrated in FIG. 1(a) according to some embodiments of the present disclosure. The first thermal conductive layer 103 may have uniform or non-uniform thermal conductivity. The uniformity of the thermal conductivity of the first thermal conductive layer 103 may depend on the variation of the number of thermal conductive particles 104a, 104b, and 104c in the first thermal conductive layer 103. For example, if the number of the thermal conductive particles 104a, 104c, and 104b varies across consecutive regions A1, A2, and A3 of first thermal conductive layer 103, it may be considered that the first thermal conductive layer 103 has non-uniform thermal conductivity. Regions A1, A2, and A3 of the first thermal conductive layer 103 are next to each other and may be defined as having the same cross-section surface area of the first thermal conductive layer 103.

In some embodiments, the first thermal conductive layer 103 has a non-uniform thermal conductivity where the number of the thermal conductive particles 104a, 104c, and 104b contained in a first region A1, second region A2, and third region A3 may be different. In some embodiments, the number of the thermal conductive particles 104a and 104b contained in the first region A1 and the third region A3 is greater than that of the second region A2 when the first thermal conductive layer 103 is formed by a printing technique by printing a thermal conductive paste through a stencil. The thermal conductive particles 104a and 104b tend to move toward two ends of the opening of the stencil when printing. Therefore, in some embodiments, the number of the thermal conductive particles 104a and 104b contained in the first region A1 and the third region A3 is greater than that of the second region A2. Since the joint quality of the second thermal conductive layers 105a, 105c, and 105b to the first thermal conductive layer 103 is highly depend on the number of the thermal conductive particles 104a, 104c, and 104b contained in the corresponding joint region of the first thermal conductive layer 103 where a higher number of the thermal conductive particles may provide higher joint strength, a region that has a lower number of thermal conductive particles may result in poor joint strength to the second thermal conductive layers 105a, 105c, and 105b. Therefore, the joint strength of the part of the second thermal conductive layer 105c to the first thermal conductive layer 103 may be poor and the part of the second thermal conductive layer 105c may disconnect to the first thermal conductive layer 103 easily. Once the bonding to the part of the second thermal conductive layer 105c is lost, the first thermal conductive layer 103 may diminish its heat dissipation effect.

Given the above and other reasons, it would be desirable to provide a semiconductor device that can further improve the heat dissipation effects of the first thermal conductive layer 103.

Figure 2A:
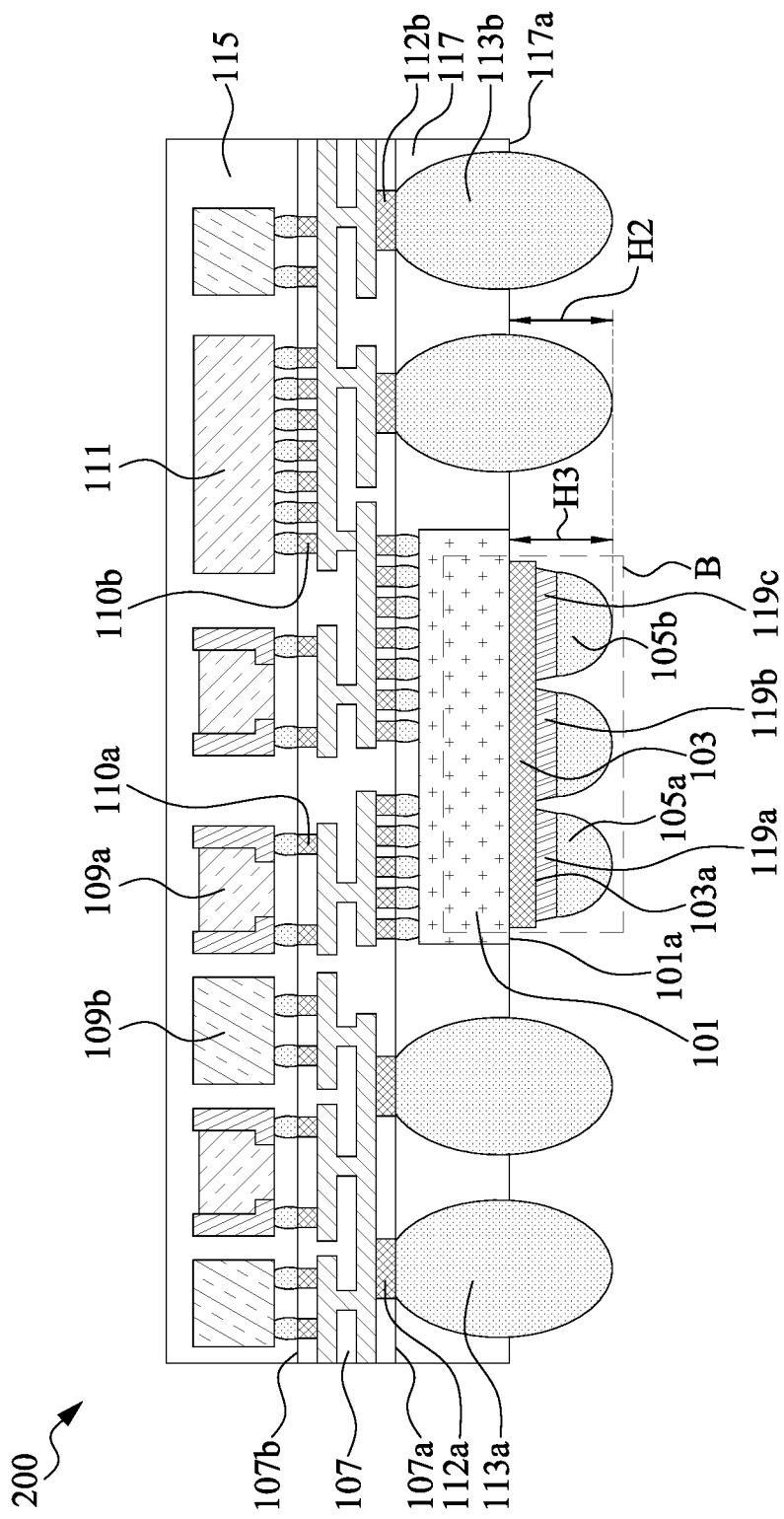
FIG. 2(a) illustrates a cross-sectional view of a semiconductor package according to some embodiments of the present disclosure.

FIG. 2(a) illustrates a cross-sectional view of a semiconductor package 200 according to some embodiments of the present disclosure. The semiconductor package 200 illustrated in FIG. 2 is similar to that illustrated in FIG. 1 with a difference including that a third thermal conductive layer 119a, 119b, 119c may be further disposed between the first thermal conductive layer 103 and the second thermal conductive layer 105a, 105b.

The third thermal conductive layer 119a, 119b, 119c may be disposed on (e.g., physical contact) the surface 103a of the first thermal conductive layer 103 and exposes a portion of the surface 103a of the first thermal conductive layer 103. A surface area or a projection area on the first surface 101a of the first electronic component 101 of the third thermal conductive layer 119a, 119b, 119c may be less than that of the first thermal conductive layer 103 so the first thermal conductive layer 103 may accommodate one or more of the third thermal conductive layer 119a, 119b, 119c.

The third thermal conductive layer 119a, 119b, 119c may include a plurality of parts 119a, 119b, 119c separated from each other or is formed as a whole. Each part 119a, 119b, 119c of the third thermal conductive layer 119a, 119b, 119c may be thermally coupled to the first thermal conductive layer 103 as long as an overall surface area of the parts 119a, 119b, 119c of the third thermal conductive layer 119a, 119b, 119c is less than that of the first thermal conductive layer 103. As described in the previous paragraph for disposing the second thermal conductive layer 105a, 105b directly on the first thermal conductive layer 103, disposing the first thermal conductive layer 103 with a larger surface area may improve its heat dissipation effect and disposing the third thermal conductive layer 119a, 119b, 119c with less surface area than the first thermal conductive layer 103, manufacturing cost may be reduced as compared to forming a single thermal conductive layer 103 to have the same height as the sum of that of the first thermal conductive layer 103 and that of the third thermal conductive layer 119a, 119b, 119c.

Each part 119a, 119b, 119c of the third thermal conductive layer 119a, 119b, 119c may be disposed adjacent to the surface 103a of the first thermal conductive layer 103. Each part 119a, 119b, 119c of the third thermal conductive layer 119a, 119b, 119c may be disposed directly on the surface 103a of the first thermal conductive layer 103. Each part 119a, 119b, 119c of the third thermal conductive layer 119a, 119b, 119c may be disposed indirectly on the surface 103a of the first thermal conductive layer 103 with a connecting element inserted therebetween. In some embodiments, each part 119a, 119b, 119c of the third thermal conductive layer 119a, 119b, 119c is disposed on (e.g., physical contact) the surface 103a of the first thermal conductive layer 103.

The third thermal conductive layer 119a, 119b, 119c may be disposed as having, for example, a substantially circular, ring, rectangular, square, triangle, oval, and polygon shape as a whole. In some embodiments where the third thermal conductive layer includes a plurality of parts 119a, 119b, 119c, each of the parts 119a, 119b, 119c are disposed as having, for example, a substantially circular, ring, rectangular, square, triangle, oval, and polygon shape and the plurality of the parts 119a, 119b, 119c of the third thermal conductive layers 119a, 119b, 119c may be arranged in random, matrix, or in a substantially circular, ring, rectangular, square, triangle, oval, and polygon shape.

Each of the parts 119a, 119b, 119c of the third thermal conductive layer 119a, 119b, 119c may correspond to one or more parts 105a, 105b of the second conductive layer 105a, 105b. A surface area or a projection area on the first surface 101a of the first electronic component 101 of each of the parts 119a, 119b, 119c of the third thermal conductive layer 119a, 119b, 119c may be equal to or greater than that of a respective part 105a, 105b of the second thermal conductive layer 105a, 105b so the third thermal conductive layer 119a, 119b, 119c may accommodate one or more parts 105a, 105b of the second thermal conductive layer 105a, 105b.

Each part 105a, 105b of the second thermal conductive layer 105a, 105b is thermally coupled to a respectively part 119a, 119b, 119c of the third thermal conductive layer 119a, 119b, 119c. Each part 105a, 105b of the second thermal conductive layer 105a, 105b may be disposed adjacent to a surface of a respectively part 119a, 119b, 119c of the third thermal conductive layer 119a, 119b, 119c. Each part 105a, 105b of the second thermal conductive layer 105a, 105b may be disposed directly on (e.g., physical contact) the surface of a respectively part 119a, 119b, 119c of the third thermal conductive layer 119a, 119b, 119c. Each part 105a, 105b of the second thermal conductive layer 105a, 105b may be disposed indirectly on the surface of a respectively part 119a, 119b, 119c of the third thermal conductive layer 119a, 119b, 119c with a connecting element inserted therebetween. In some embodiments, each part 105a, 105b of the second thermal conductive layer 105a, 105b are disposed on (e.g., physical contact) the surface of a respectively part 119a, 119b, 119c of the third thermal conductive layer 119a, 119b, 119c.

By disposing the third thermal conductive layer 119a, 119b, 119c with a smaller surface area than that of the first thermal conductive layer 103 between the first thermal conductive layer 103 and the second thermal conductive layer 105a, 105b, the joint issue between the first thermal conductive layer 103 and the second thermal conductive layer 105a, 105b mentioned above may be improved as the second thermal conductive layer 105a, 105b contacts the third thermal conductive layer 119a, 119b, 119c, rather than the first thermal conductive layer 103 directly and a smaller area of the third thermal conductive layer 119a, 119b, 119c can provide better joint quality to the second thermal conductive layer 105a, 105b as a smaller surface area of the thermal conductive layer may have relatively better thermal conductive material uniformity. As a result, since the joint issue between the first thermal conductive layer 103 and the second thermal conductive layer 105a, 105b mentioned above may be resolved, more parts of the second thermal conductive layer 105a, 105b may be successfully thermally coupled to the first thermal conductive layer 103 and the heat dissipation effect of the first thermal conductive layer 103 may be improved. A surface area or a projection area on the first surface 101a of the first electronic component 101 of each of the parts 119a, 119b, 119c of the third thermal conductive layer 119a, 119b, 119c from bottom view may be about 200 μm×about 200 μm, about 300 μm×about 300 μm, about 400 μm×about 400 μm, about 500 μm×about 500 μm, and about 600 μm×about 600 μm. A surface area or a projection area on the first surface 101a of the first electronic component 101 of each of the parts 105a, 105b of the second thermal conductive layer 105a, 105b from bottom view may have a substantially circular shape having a diameter of about 100 μm, about 150 μm, about 200 μm, about 250 μm, about 300 μm, and about 350 μm. In some embodiments, the surface area or a projection area on the first surface 101a of the first electronic component 101 of each of the parts 119a, 119b, 119c of the third thermal conductive layer 119a, 119b, 119c is about 400 μm×about 400 μm and that of each of the parts 105a, 105b of the second thermal conductive layer 105a, 105b has a substantially circular shape having a diameter of about 250 μm.

Each part 119a, 119b, 119c of the third thermal conductive layer 119a, 119b, 119c may include a thermal conductive material, for example, copper or solder. Each part 119a, 119b, 119c of the third thermal conductive layer 119a, 119b, 119c may include thermal conductive particles, including, for example, copper or solder. Each part 119a, 119b, 119c of the third thermal conductive layer 119a, 119b, 119c may include thermal conductive particles and an adhesive material. In some embodiments, each part 119a, 119b, 119c of the third thermal conductive layer 119a, 119b, 119c may include a thermal conductive paste, including, for example, a copper paste. The material of the third thermal conductive layer 119a, 119b, 119c may be the same as or different from that of the first thermal conductive layer 103. In some embodiments, the first thermal conductive layer and the third thermal conductive layers connect at an interface. In some embodiments where the first thermal conductive layer 103 and the third thermal conductive layer 119a, 119b, 119c include the same material, such as copper, the joint quality between them may be further improved. The material of the third thermal conductive layer 119a, 119b, 119c may be the same as or different from that of the second thermal conductive layer 105a, 105b. In some embodiments where the second thermal conductive layer 105a, 105b includes a solderable element, the second thermal conductive layer 105a, 105b may form an intermetallic compound with a thermal conductive particle of a respective third thermal conductive layer 119a, 119b, 119c.

As described in the previous paragraphs, connection failure of the electrical connector 113a, 113b caused by the size deviation resulted from its manufacturing process may be reduced by utilizing a solderable element as the second thermal conductive layer 105a, 105b. In addition, such effects may be further enhanced if the second thermal conductive layer 105a, 105b and the third thermal conductive layer 119a, 119b, 119c are so disposed that the third height H3 of the second thermal conductive layer 105a, 105b, the third thermal conductive layer 119a, 119b, 119c, and the first thermal conductive layer 103 is substantially the same as the second height H2 after reflow.

FIG. 2(b) illustrates a bottom view of the semiconductor package 200 illustrated in FIG. 2(a) according to some embodiments of the present disclosure. As shown in FIG. 2(b), each part 119a, 119b, 119c of the third thermal conductive layer 119a, 119b, 119c may have a substantially circular shape and an overall surface area of the parts 119a, 119b, 119c of the third thermal conductive layer 119a, 119b, 119c is smaller than that of the first thermal conductive layer 103. In addition, each part 119a, 119b, 119c of the third thermal conductive layer 119a, 119b, 119c may correspond to a respective part 105a, 105b, 105c of the second thermal conductive layer 105a, 105c, 105b. Each part 119a, 119b, 119c of the third thermal conductive layer 119a, 119b, 119c may have a surface area greater than a respective part 105a, 105b, 105c of the second thermal conductive layer 105a, 105c, 105b. The parts 119a, 119b, 119c of the third thermal conductive layers 119a, 119b, 119c may be disposed in matrix or a substantially square shape.

Figure 2C:
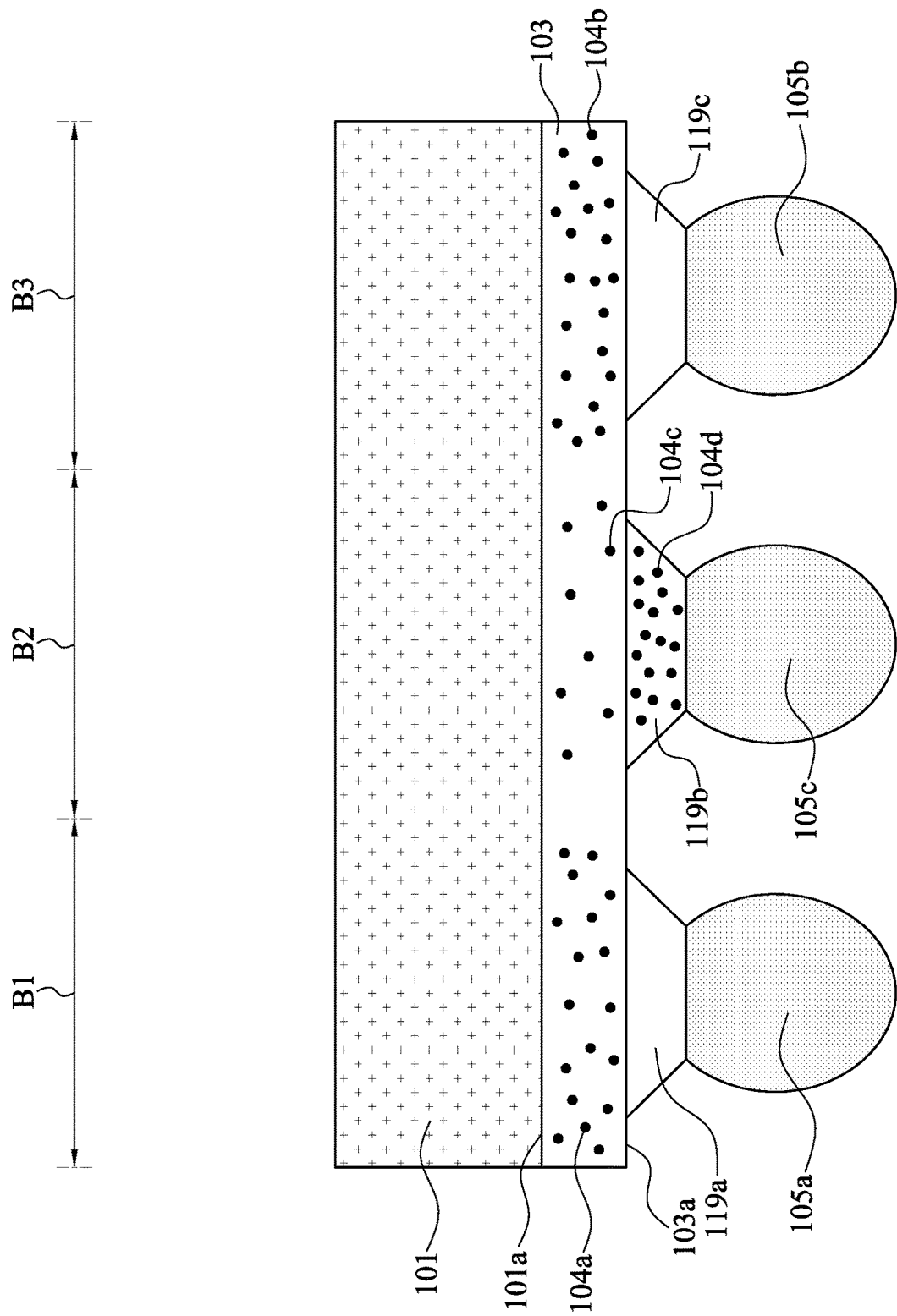
FIG. 2(c) illustrates an enlarged view of a region B of the semiconductor package illustrated in FIG. 2(a) according to some embodiments of the present disclosure.

FIG. 2(c) illustrates an enlarged view of a region B of the semiconductor package 200 illustrated in FIG. 2(a) according to some embodiments of the present disclosure. Each part 119a, 119b, 119c of the third thermal conductive layers 119a, 119b, 119c may have similar or different thermal conductivity. A thermal conductivity of a part 119b of the third thermal conductive layer may be greater than another part 119a, 119c of the third thermal conductive layer. The thermal conductivity of each part 119a, 119b, 119c of the third thermal conductive layers 119a, 119c should be greater than a corresponding region B1, B2, and B3 of the first thermal conductive layer 103. In some embodiments, the number of the thermal conductive particles 104d contained in a part 119b of the third thermal conductive layer is greater than that in another part 119a, 119c of the third thermal conductive layer. In some embodiments, the number of the thermal conductive particles contained in each part 119a, 119b, 119c of the third thermal conductive layers 119a, 119c is greater than that contained in the corresponding region B1, B2, and B3 of the first thermal conductive layer 103 so each part 119a, 119b, 119c of the third thermal conductive layers 119a, 119c may provide better joint quality than the first thermal conductive layer 103 to the second thermal conductive layer 105c. As a result, poor joint quality issue of the first thermal conductive layer 103 to the second thermal conductive layer 105c due to the non-uniformity of the thermal conductive particles 104a, 104b, and 104c contained in the first thermal conductive layer 103 may be resolved. Thus, heat dissipation effect of the first thermal conductive layer 103 may be improved as more second thermal conductive layer 105a, 105c, 105b may be successfully thermally coupled to the first thermal conductive layer 103.

The number of the thermal conductive particles contained in each part 119a, 119b, 119c of the third thermal conductive layers 119a, 119c and that in the corresponding region B1, B2, and B3 of the first thermal conductive layer 103 may be determined by counting the number of the thermal conductive particles contained in a cross-section surface area of each part 119a, 119b, 119c of the third thermal conductive layers 119a, 119c and in the same cross-section surface area of the corresponding region B1, B2, and B3 of the first thermal conductive layer 103.

The number of the thermal conductive particles contained in each part 119a, 119b, 119c of the third thermal conductive layers 119a, 119c and that in the corresponding region B1, B2, and B3 of the first thermal conductive layer 103 may also be determined by counting the number of the thermal conductive particles contained in a surface area or a projection area on the first surface 101a of the first electronic component 101 of each of the parts 119a, 119b, 119c of the third thermal conductive layer 119a, 119c and that of the corresponding region B1, B2, and B3 of the first thermal conductive layer 103 from bottom view. For example, the numbers may be determined by counting the number of the thermal conductive particles contained in a surface area or a projection area on the first surface 101a of the first electronic component 101 of each of the parts 119a, 119b, 119c of the third thermal conductive layer 119a, 119c and that of the corresponding region B1, B2, and B3 of the first thermal conductive layer 103 of about 400 μm× about 400 μm from bottom view.

Figure 3:
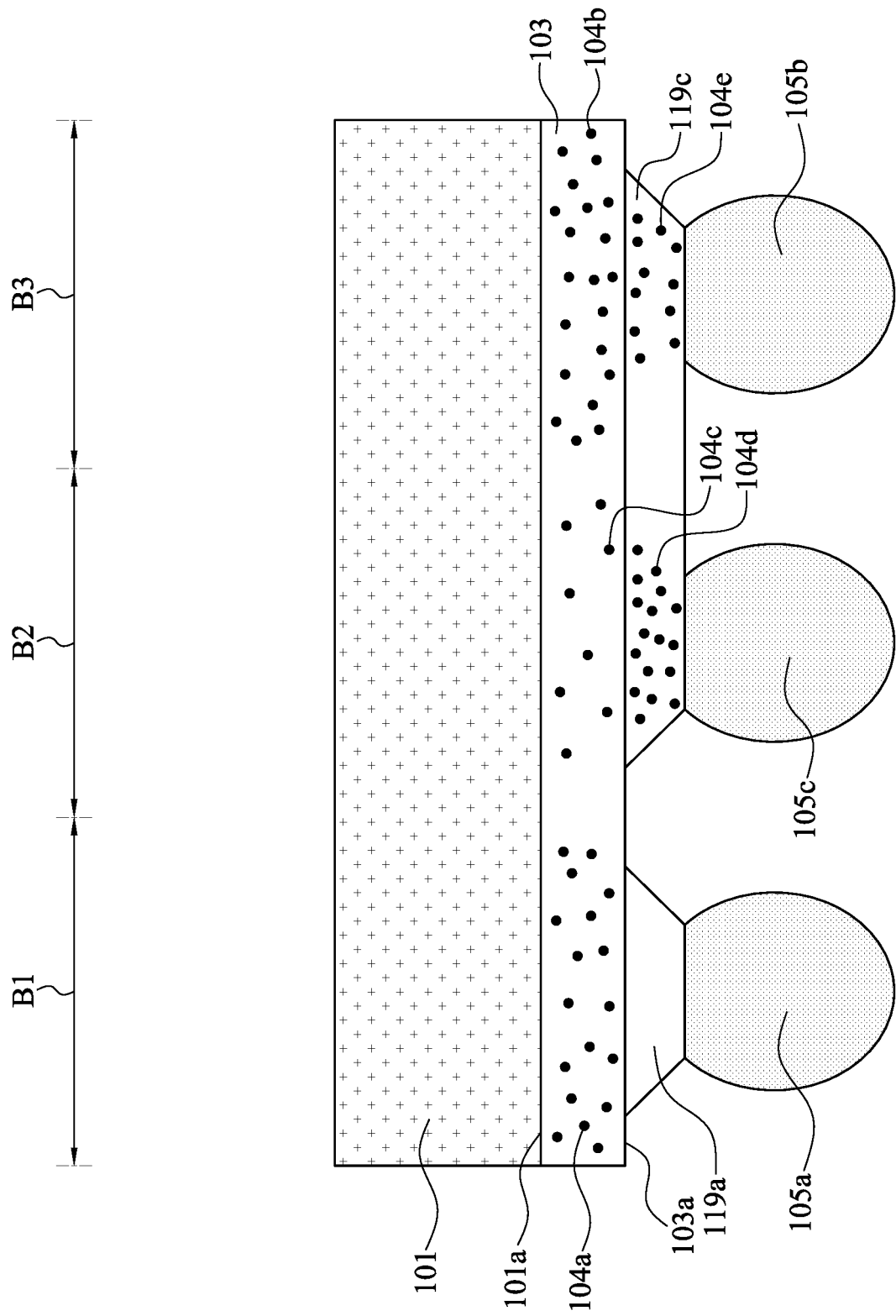
FIG. 3 illustrates an enlarged view of a region B of the semiconductor package illustrated in FIG. 2(a) according to some embodiments of the present disclosure.

FIG. 3 illustrates an enlarged view of a region B of the semiconductor package 200 illustrated in FIG. 2(a) according to some embodiments of the present disclosure. The semiconductor package illustrated in FIG. 3 is similar to that illustrated in FIG. 2(c) with a difference including that at least one part 119c of the third thermal conductive layer 119c may correspond to more than one parts 105c, 105b of the second thermal conductive layer 105c, 105b and the third thermal conductive layer 119c may be non-uniform in thermal conductivity.

One part 119c of the third thermal conductive layer may have a cross-section area or a projection area on the surface 101a of the first electronic component 101 different from that of other part 119a of the third thermal conductive layer. In some embodiments, one part 119c of the third thermal conductive layer has a cross-section area larger than that of other part 119a of the third thermal conductive layer. In some embodiments, one part 119c of the third thermal conductive layer has a projection area on the surface 101a of the first electronic component 101 larger than that of other part 119a of the third thermal conductive layer.

As shown in FIG. 3, the number of the thermal conductive particles 104d contained in the region B2 of the third thermal conductive layer 119c may be greater than the thermal conductive particles 104 contained in the region B3 of the same layer. As a result, the joint quality of the part 105c of the second thermal conductive layer 105c to the region B2 of the third thermal conductive layer 103 may be better than the part 105b of the second thermal conducive layer 105b to the region B3 of the third thermal conductive layer 103 relatively. Nevertheless, since the surface area of the part 119c of the third thermal conductive layer 119c is still smaller than that of the first thermal conductive layer 103 and thus has better uniformity, the part 119c of the third thermal conducive layer 119c can still provide better joint quality than the first thermal conductive layer 103 to the part 105b of the second thermal conductive layer 105b relatively. Thus, although the joint quality of the part 105b of the second thermal conductive layer 105b to the region B3 of the third thermal conductive layer 103 is relatively poor than the part 105c of the second thermal conducive layer 105c to the region B3 of the third thermal conductive layer 103, the part 105b of the second thermal conductive layer 105b may still joint to the part 119c of the third thermal conductive layer 103 successfully.

Figure 4:
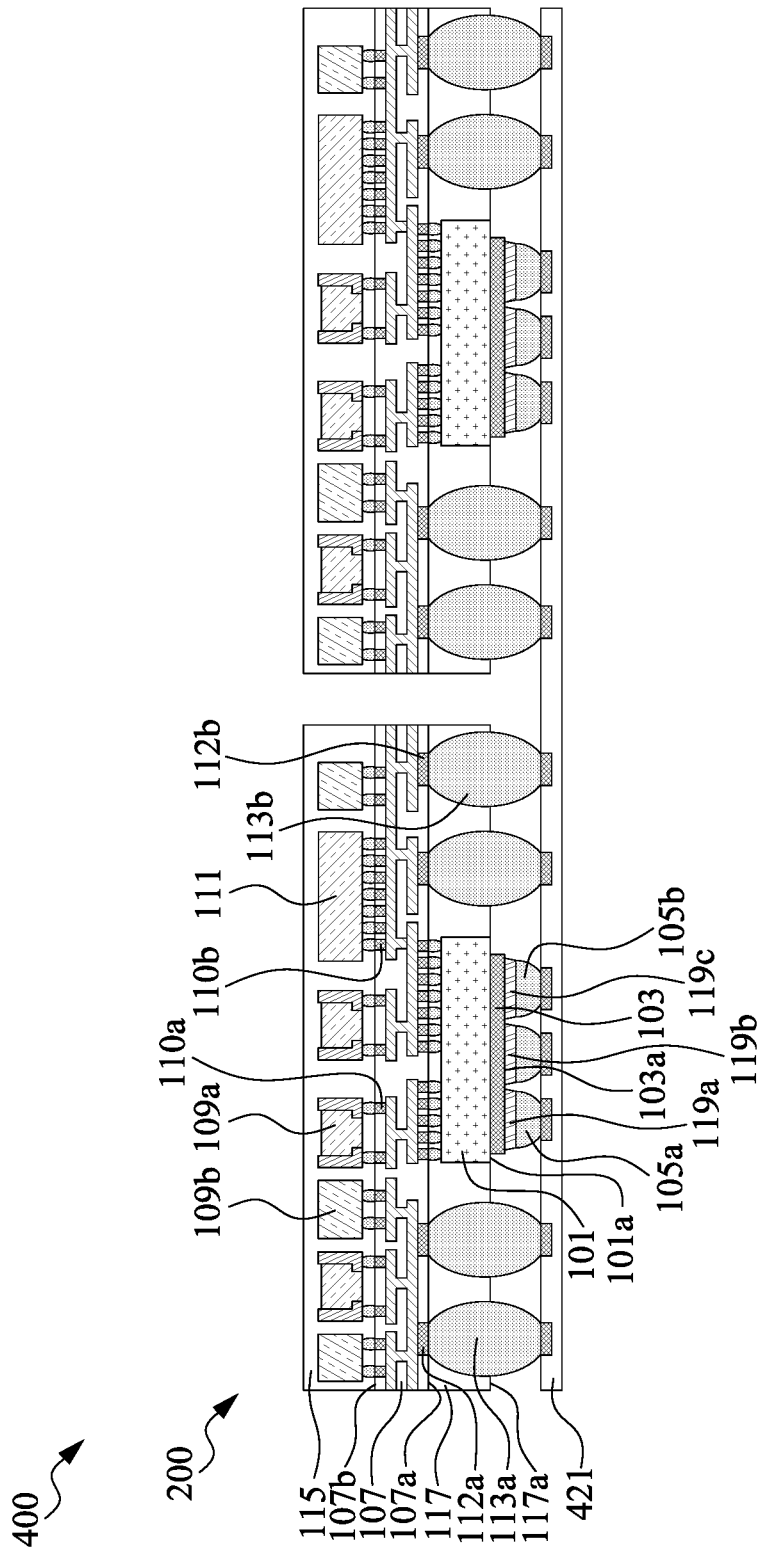
FIG. 4 illustrates a cross-sectional view of a semiconductor package according to some embodiments of the present disclosure.

FIG. 4 illustrates a cross-sectional view of a semiconductor package 400 according to some embodiments of the present disclosure. The semiconductor package 400 illustrated in FIG. 4 is similar to that illustrated in FIG. 2(a) with a difference including that the semiconductor package 200 illustrated in FIG. 2(a) may be further disclosed adjacent to a second substrate 421.

The semiconductor package 200 may electrically connect to the second substrate 421. In some embodiments, the semiconductor package 200 electrically connects to the second substrate 421 by the electrical connector 113a, 113b.

The second substrate 421 may be a printed circuit board, a unit substrate, a strip substrate, or a combination thereof. A unit substrate may include, for example, a unit chip (e.g., a communication chip, a microprocessor chip, a graphics chip, or a microelectromechanical systems (MEMS) chip diced from a wafer), a unit package, a unit interposer, or a combination thereof. A strip substrate may include, for example, a plurality of unit substrates, unit chips (e.g., communication chips, microprocessor chips, graphics chips, or microelectromechanical systems (MEMS) chips diced from a wafer), unit packages, unit interposers, or a combination thereof. In some embodiments, the second substrate 421 is a strip substrate. In some embodiments, the second substrate 421 is a unit substrate after singularizing.

FIGS. 5A-5J illustrate a method of manufacturing a semiconductor package such as the semiconductor package of FIG. 2(a). FIGS. 5A-5K illustrate a method of manufacturing a semiconductor package such as the semiconductor package of FIG. 4.

Figure 5A:
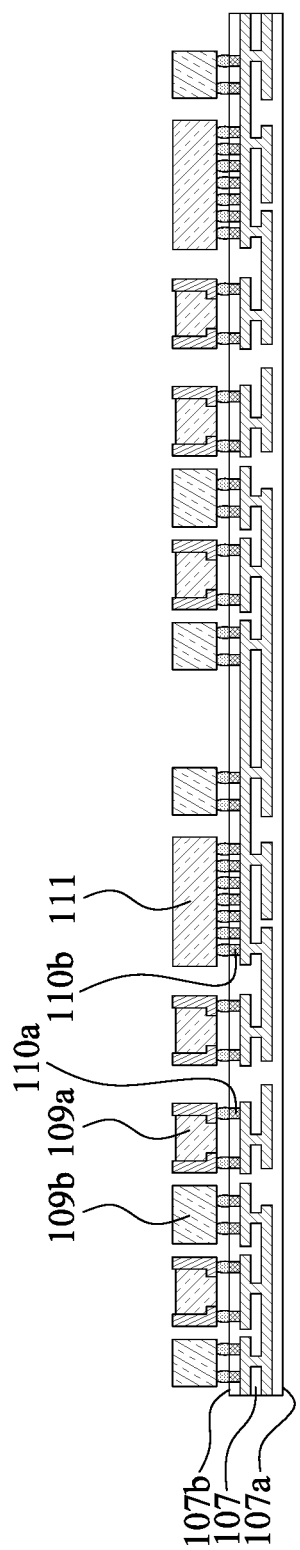
FIG. 5A, FIG. 5B, FIG. 5C, FIG. 5D, FIG. 5E, FIG. 5F, FIG. 5G, FIG. 5H, FIG. 5I, and FIG. 5J illustrate a method for manufacturing a semiconductor package such as the semiconductor package of FIG. 2(a).

Referring to FIG. 5A, a first substrate 107 is provided. The first substrate 107 has a first surface 107a and a second surface 107b opposite to the first surface 107a. The first substrate 107 may be a strip substrate. At least one second electronic component 109a, 109b, 111 may be disposed adjacent to the second surface 107b of the first substrate 107 and electrically connect to the first substrate 107 by electrical contact 110a, 110b disposed on (e.g., physical contact or embedded in and exposed by) the second surface 107b of the first substrate 107. The second electronic component 109a, 109b, 111 may include an active component 111 (e.g., a die or a chip) and a passive component 109a, 109b, (e.g., a capacitor, an inductor, or a resistor).

Figure 5B:
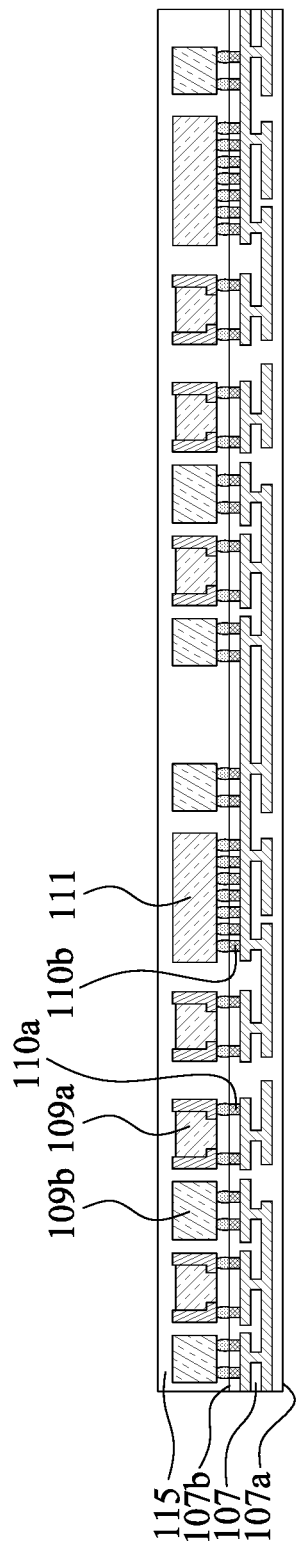

Referring to FIG. 5B, a second encapsulant 115 is disposed adjacent to the second surface 107b of the first substrate 107. The second encapsulant 115 may encapsulate the second electronic component 109a, 109b, 111. The second encapsulant 115 may be formed by, for example, a molding technique.

Figure 5C:
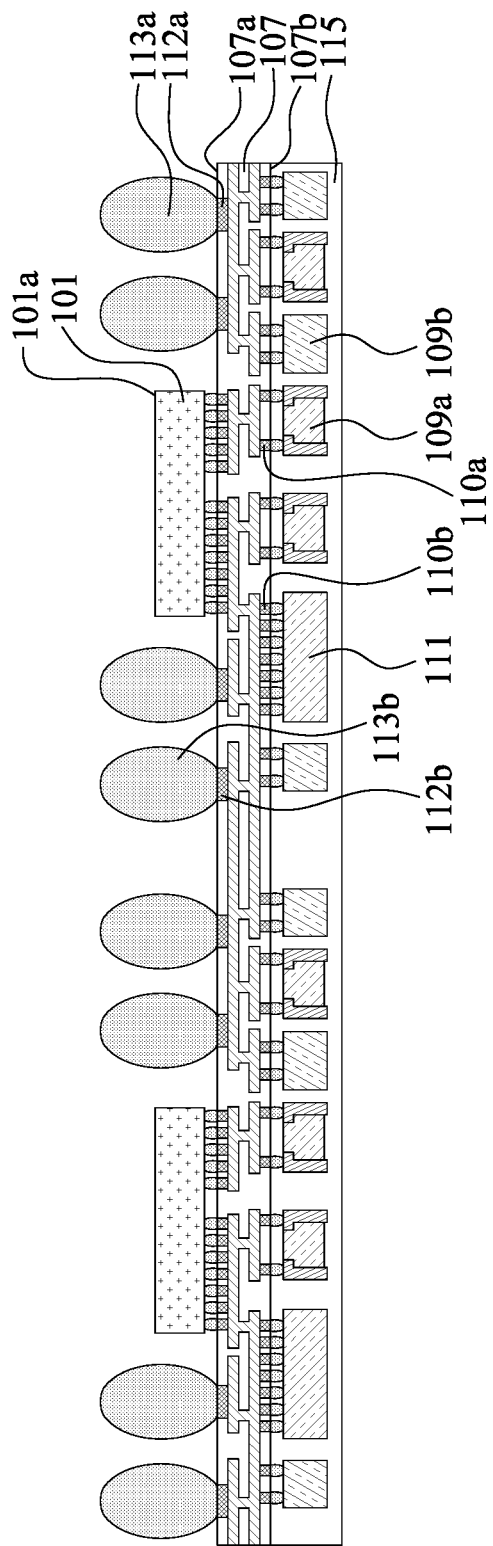

Referring to FIG. 5C, a first electronic component 101 is disposed adjacent to the first surface 107a of the first substrate 107 and electrically connects to the first substrate 107. The first electronic component 101 may include an active component (e.g., a die or a chip). In addition, an electrical connector 113a, 113b is disposed adjacent to the first surface 107a of the first substrate 107. The electrical connector 113a, 113b may electrically connect to the first surface 107a of the first substrate 107 by electrical contact 112a disposed on (e.g., physical contact or embedded in and exposed by) the first surface 107a of the first substrate 107.

Figure 5D:
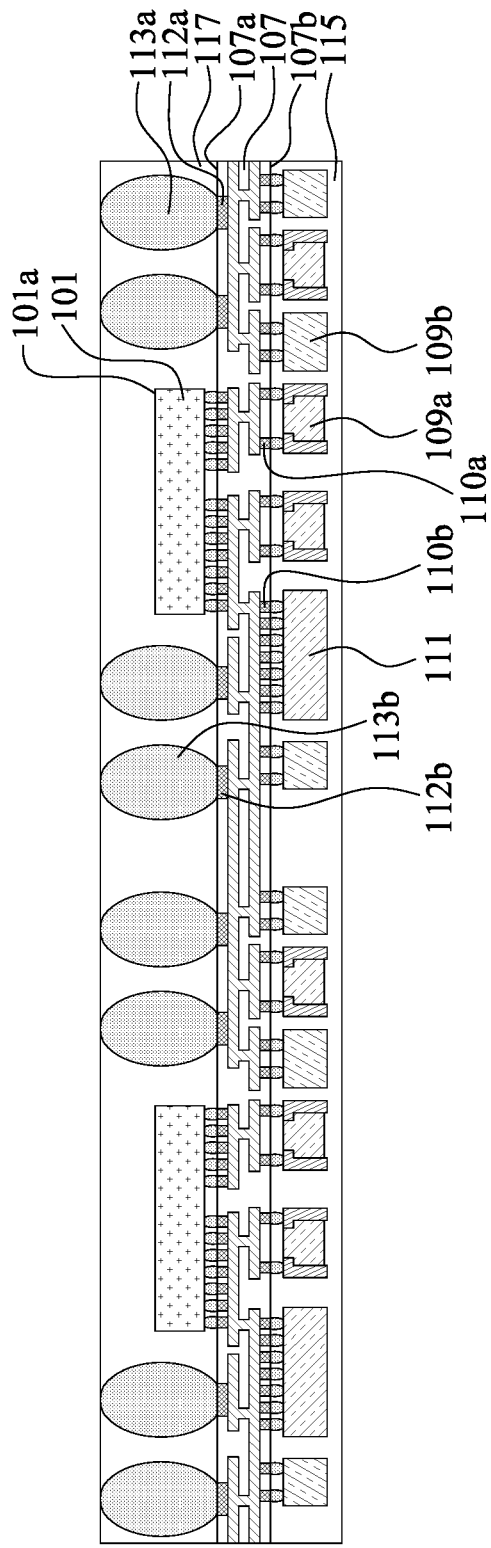

Referring to FIG. 5D, a first encapsulant 117 is disposed adjacent to the first surface 107a of the first substrate 107. The first encapsulant 117 may encapsulate the first electronic component 101 and the electrical connector 113a, 113b. The first encapsulant 117 may be formed by, for example, a molding technique.

Figure 5E:
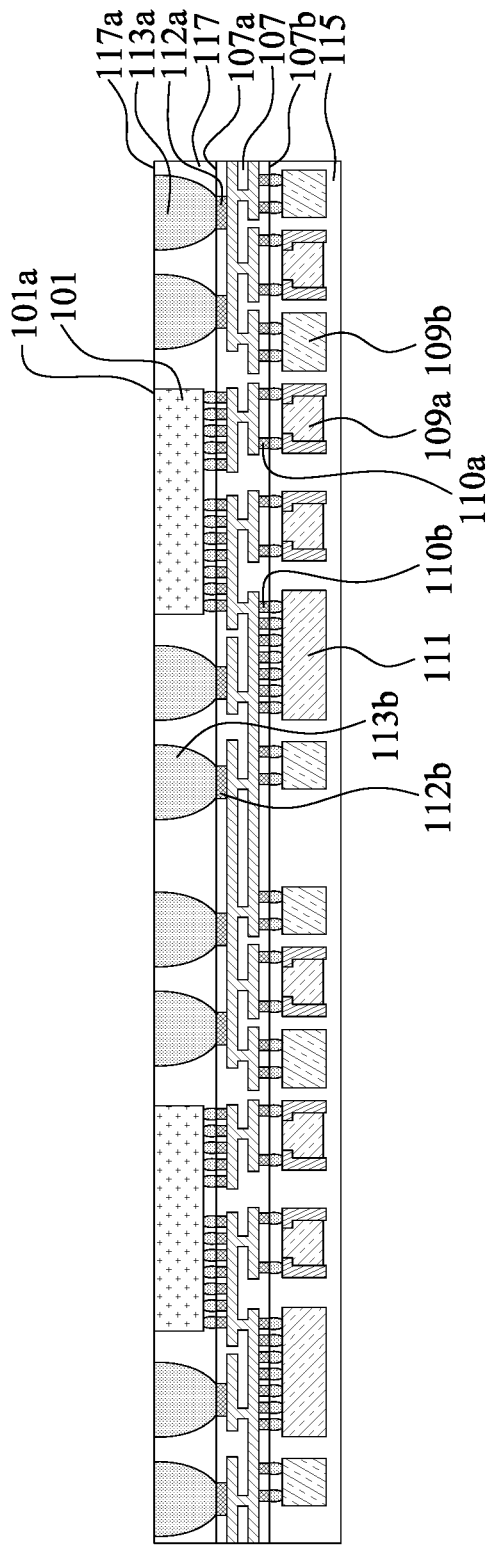

Referring to FIG. 5E, a removing process is performed on the first encapsulant 117 until a first surface 101a of the first electronic component 101 is exposed. The removing process may be performed by, for example, a polishing or grinding technique.

Figure 5F:
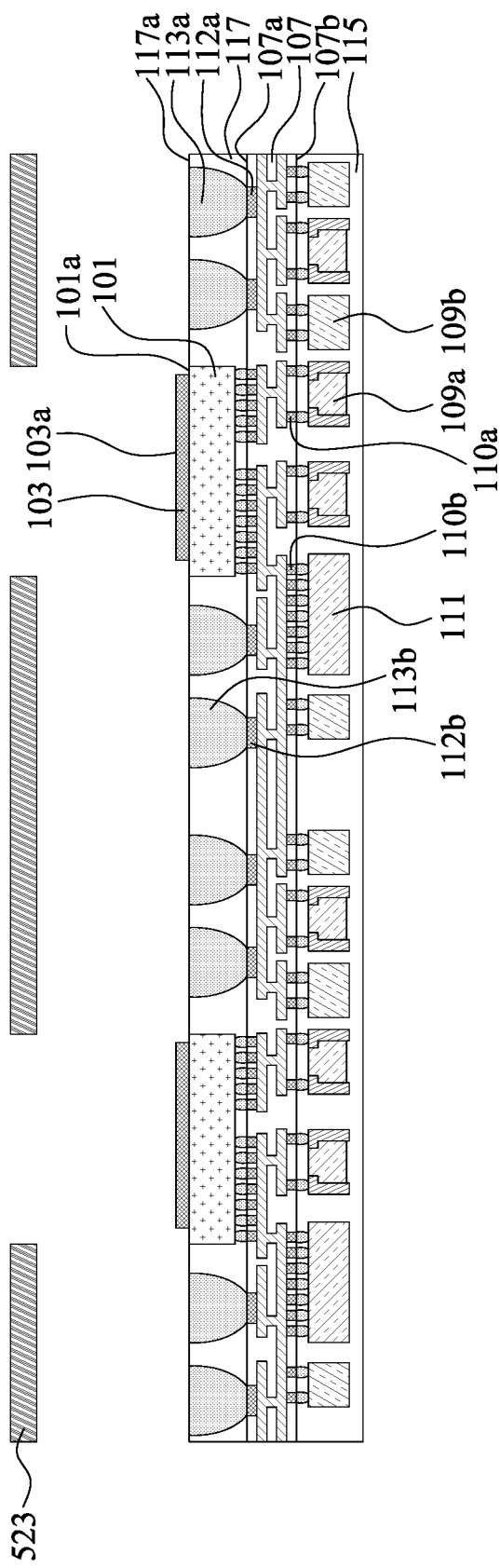

Referring to FIG. 5F, a conductive layer 103 may be formed on the first surface 101a of the first electronic component 101. The conductive layer 103 may include thermal conductive particles and is formed by, for example, a printing technique (e.g., a stencil printing technique, a screen printing technique, a spraying technique, a coating technique, an ink jetting technique, a dispensing technique), a sputtering technique, and a plating technique. The printing technique is preferable compared to the sputtering technique as forming the conductive layer 103 on a selected area requires a selective sputtering technique, which involves relatively complicated processes compared to the printing technique. In addition, compared to the printing technique, in order to form a thickness that would not affect the joint quality, the sputtering technique would need more time. The printing technique is also preferable compared to the plating technique as the plating technique is relatively complicated compared to the printing technique. In addition, plating technique needs to immerse the electronic component into a strong acid solution for a certain period of time, which may damage the electronic component and adversely affect its performance. In addition, use of a strong acid solution is not environmental friendly. In some embodiments, the conductive layer 103 is formed by a printing technique, for example, a stencil printing technique using a stencil 523.

Figure 5G:
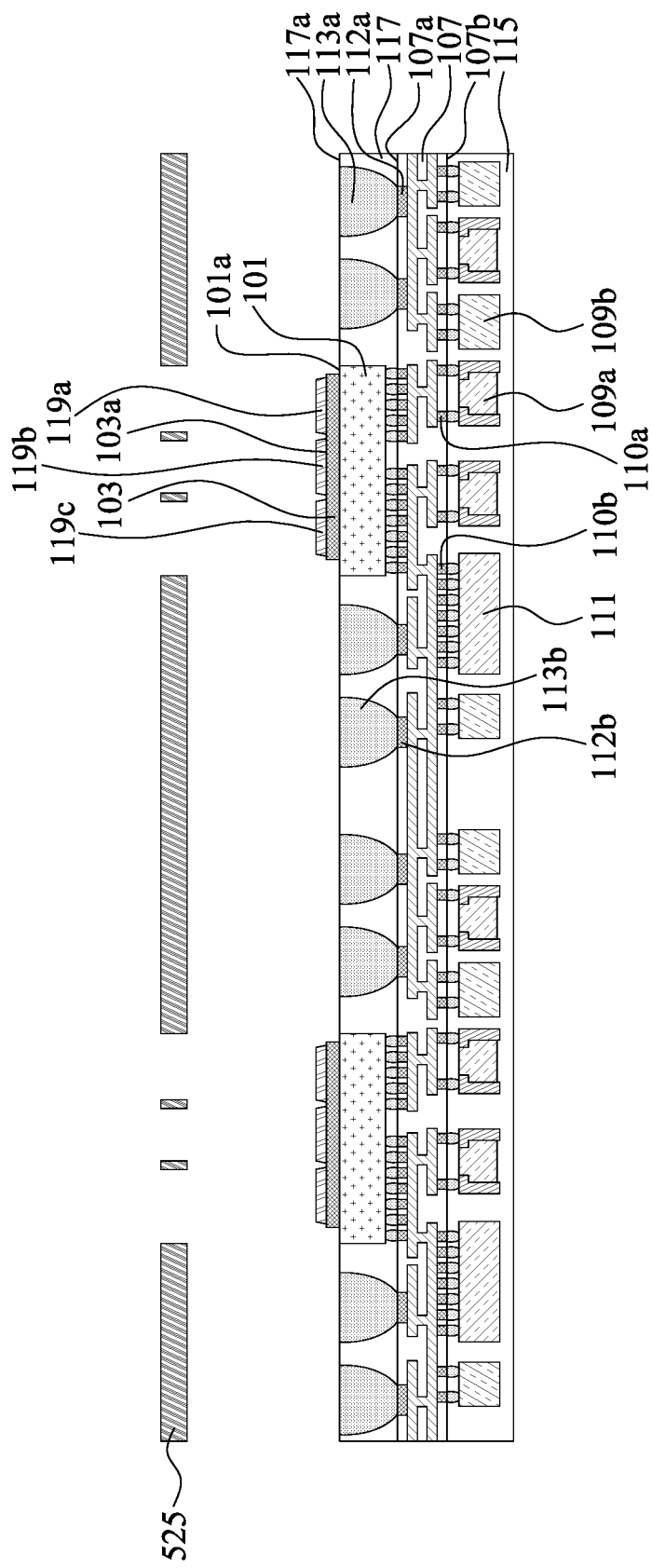

Referring to FIG. 5G, a conductive material including thermal conductive particles may be formed adjacent to the conductive layer 103 for the third thermal conductive layer 119a, 119b, 119c. The conductive material may be formed by, for example, a printing technique (e.g., a stencil printing technique, a screen printing technique, a spraying technique, a coating technique, an ink jetting technique, a dispensing technique), a sputtering technique, and a plating technique. As described above, the printing technique is preferable compared to the sputtering technique and plating technique. In some embodiments, the conductive material is formed on a predetermined portion of the conductive layer 103 by a printing technique, for example, a stencil printing technique using a stencil 525. The stencil 525 may have a smaller opening pattern than the stencil 523 applied for forming the conductive layer 103 so the third thermal conductive layer 119a, 119b, 119c can be formed on the conductive layer 103 with a smaller surface area or projection area on the first surface 101a of the first electronic component 101 by the conductive material.

Since the third thermal conductive layer 119a, 119b, 119c may be formed on a predetermined portion of the conductive layer 103 by a printing technique with a smaller opening pattern than that applied for the conductive layer 103, the third thermal conductive layer 119a, 119b, 119c may be formed with higher thermal conductive particle uniformity or as having more thermal conductive particles in a given cross-section surface area or bottom surface than the conductive layer 103 because a smaller opening pattern may limit the movement of the thermal conductive particles more than a larger one so the particles may distribute more intense in a smaller opening pattern than those in a larger one. As a result, by utilizing a stencil 525 having a smaller opening pattern than the stencil 523 applied for forming the conductive layer 103, the third thermal conductive layer 119a, 119b, 119c may be formed with better thermal conductive particle uniformity or as having more thermal conductive particles in a given cross-section surface area or bottom surface than the conductive layer 103. A size of the opening of the stencil 525 may be about 200 µm×about 200 µm, about 300 µm×about 300 µm, about 400 µm×about 400 µm, about 500 µm×about 500 µm, and about 600 µm×about 600 µm. In some embodiments, a size of the opening of the stencil 525 is about 400 µm×about 400 µm.

Figure 5H:
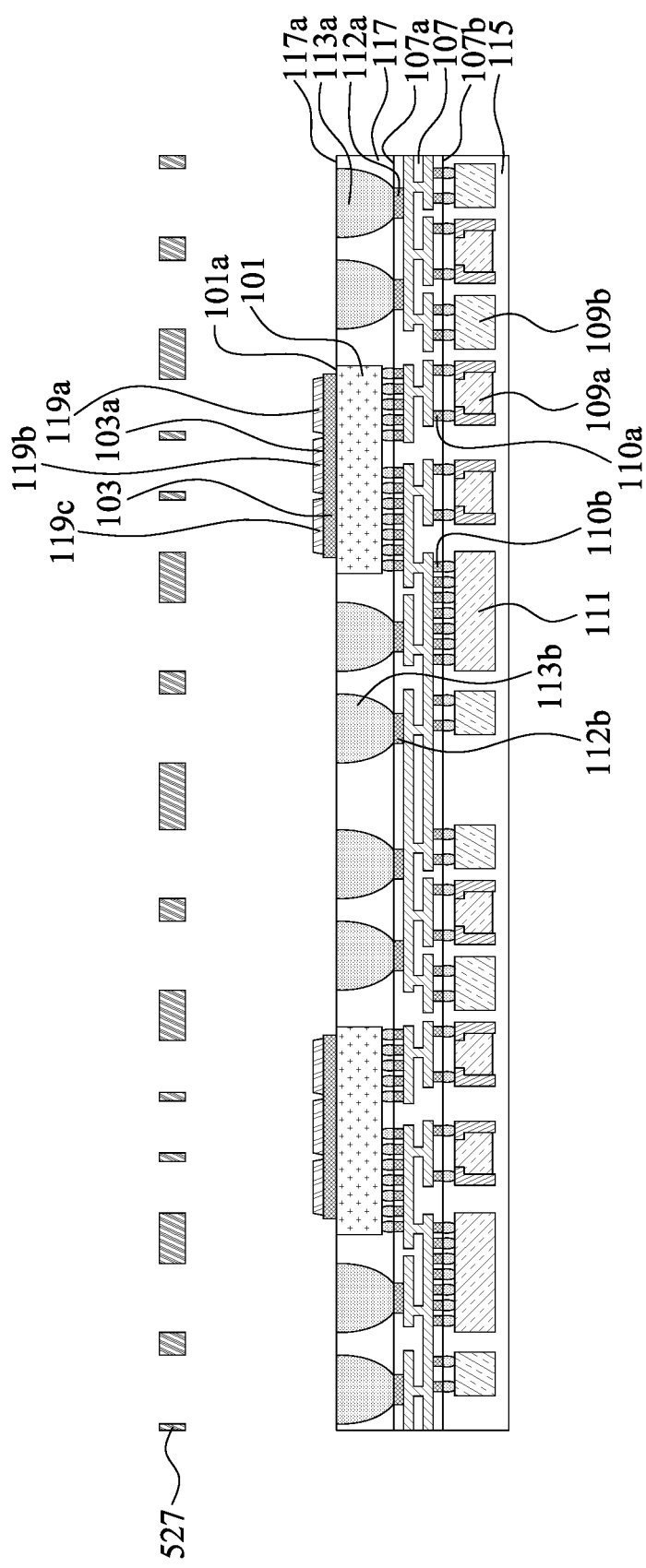

Referring to FIG. 5H, a stencil printing technique is applied and a stencil 527 is placed above for forming a solderable material on the conductive material 119a, 119b, 119c for a second thermal conductive layer 105a, 105b and an electrical connector 113a, 113b. The second thermal conductive layer 105a, 105b may be a solderable element. The opening of the stencil 527 may have a substantially circular shape having a diameter of about 100 µm, about 150 µm, about 200 µm, about 250 µm, about 300 µm, and about 350 µm. In some embodiments, the opening of the stencil 525 has a substantially circular shape having a diameter of about 250 µm.

Figure 5I:
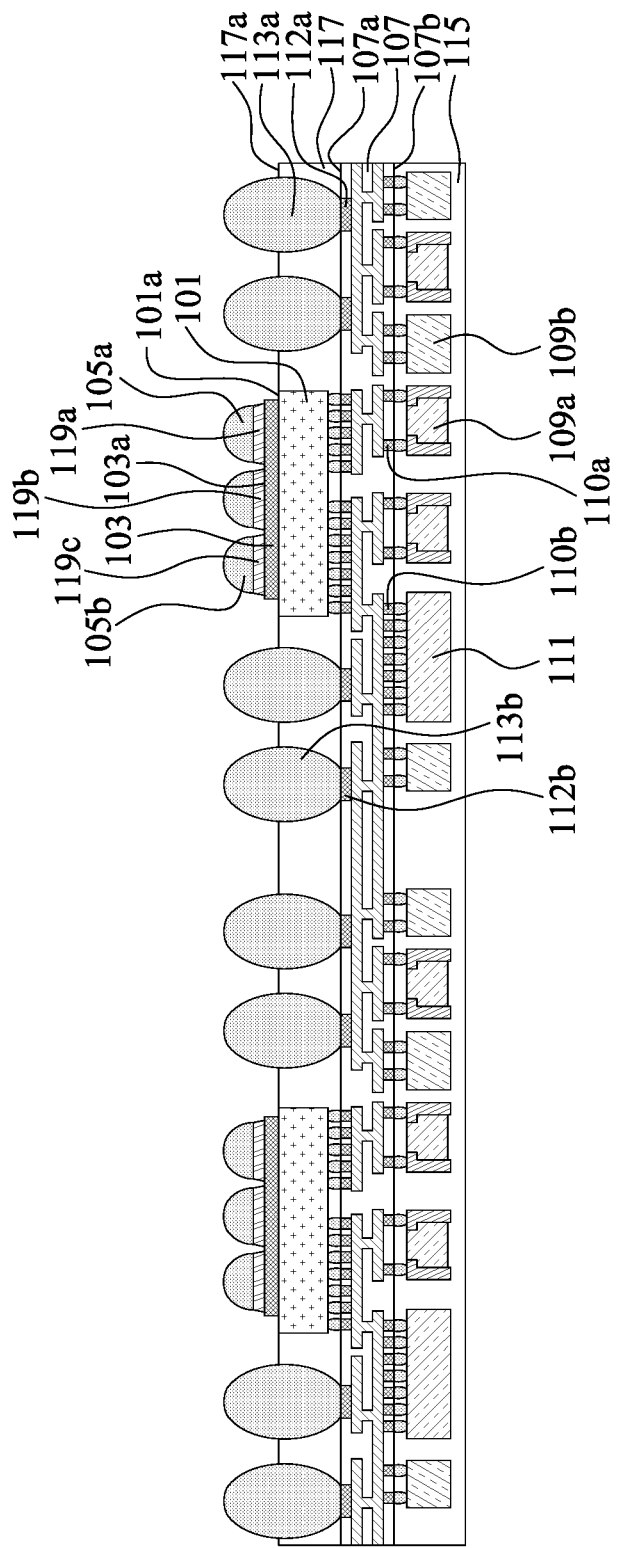

Referring to FIG. 5I, the second thermal conductive layer 105a, 105b may be formed on the third thermal conductive layer 119a, 119b, 119c and the electrical connector 113a, 113b may be formed adjacent to the first surface 117a of the first encapsulant 117 after reflowing the second thermal conductive layer 105a, 105b and the electrical connector 113a, 113b.

Figure 5J:
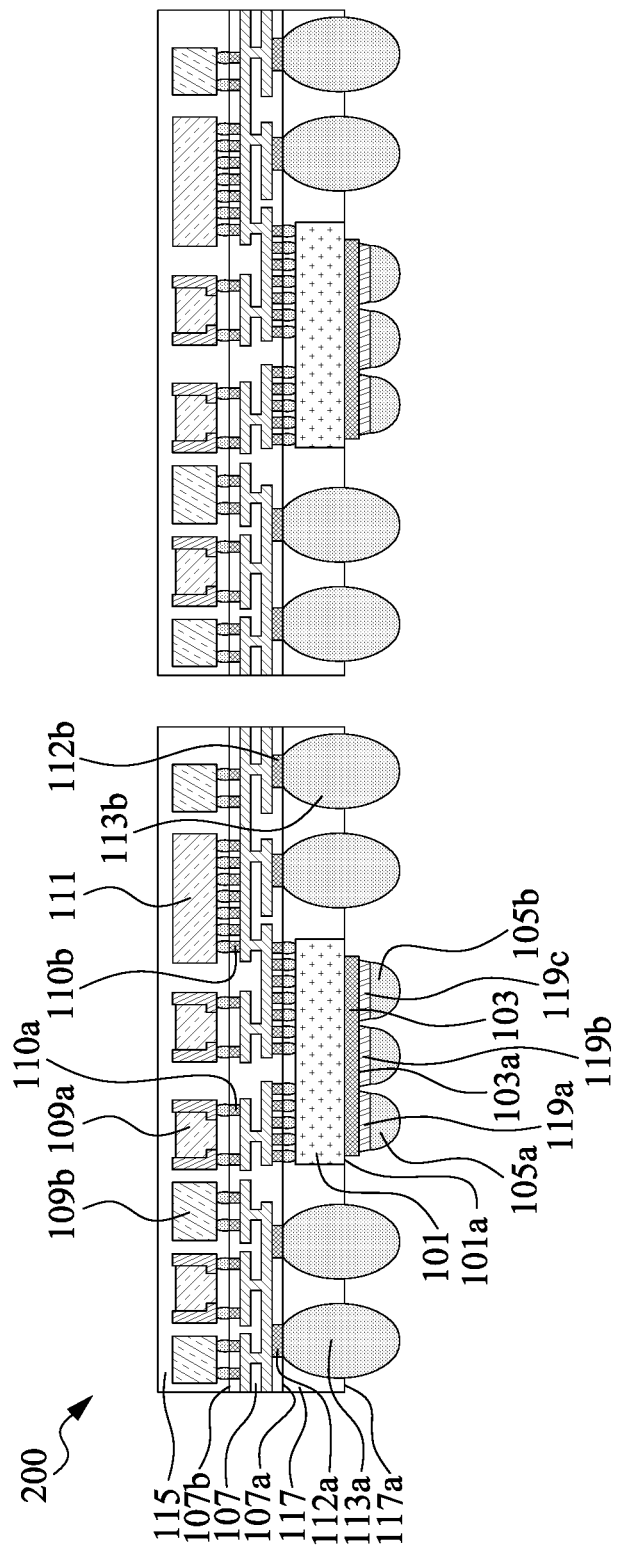

Referring to FIG. 5J, a singularizing process (e.g., a sawing process) is performed, a semiconductor package (e.g., a semiconductor package 200 as is illustrated in FIG. 2(a)) may be obtained.

Figure 5K:
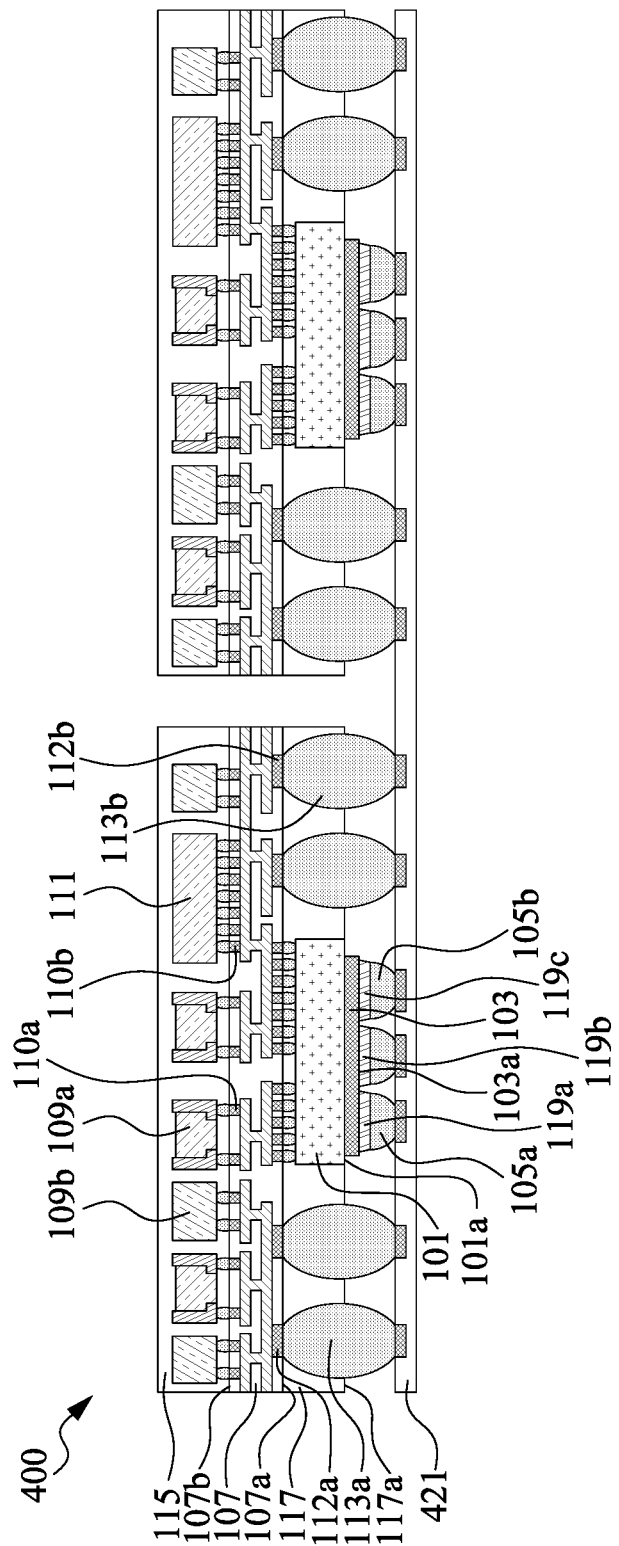

Referring to FIG. 5K, the semiconductor package 200 obtained in FIG. 5J may be further electrically connected to a second substrate 421 by connecting the electrical connector 113a, 113b to the second substrate 421. Afterwards, a semiconductor package (e.g., a semiconductor package 400 as is illustrated in FIG. 4) may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:
   an electronic component having a surface;
   a first thermal conductive layer disposed adjacent to the surface of the electronic component and having a plurality of first thermal conductive particles;
   a second thermal conductive layer disposed over the first thermal conductive layer and exposing a portion of the first thermal conductive layer, the second thermal conductive layer having a plurality of second thermal conductive particles; and
   at least a solderable element disposed on the second thermal conductive layer,
   wherein in a cross-sectional view, a number of the plurality of first thermal conductive particles in a first portion of the first thermal conductive layer is less than a number of the plurality of the second thermal conductive particles in a second portion of the second thermal conductive layer, and an area of the first portion is substantially equal to an area of the second portion.

2. The semiconductor device according to claim 1, wherein the first thermal conductive layer comprises a monolithic layer exposing a portion of the surface of the electronic component, wherein a width of the first thermal conductive layer is greater than at least an half of a width of the electronic component.

3. The semiconductor device according to claim 2, wherein the electronic component has a first side and a second side opposite to the first side, and the monolithic layer has a first lateral surface closer to the first side than to the second side and a second lateral surface closer to the second side than to the first side, and wherein the first lateral surface is spaced apart from the first side by a first distance, the second lateral surface is spaced apart from the second side by a second distance different from the first distance.

4. The semiconductor device according to claim 1, wherein the first thermal conductive layer comprises a first adhesive material, and the first thermal conductive particles embedded in the first adhesive material, wherein the first adhesive material has a first region, a second region, and a third region between the first region and the second region, and wherein in the cross-sectional view a number of the first thermal conductive particles contained in the first region and a number of the first thermal conductive particles contained in the second region are both greater than a number of the first thermal conductive particles contained in the third region.

5. The semiconductor device according to claim 4, wherein the first adhesive material has a fourth region and a fifth region vertically non-overlapped with the solderable element, the fourth region is between the first region and the third region, and the fifth region is between the third region and the second region, wherein a number of the first thermal conductive particles contained in the fourth region is less than each of the number of the first thermal conductive particles contained in the first region and the number of the first thermal conductive particles contained in the third region, and wherein a number of the first thermal conductive particles contained in the fifth region is less than each of the number of the first thermal conductive particles contained in the third region and the number of the first thermal conductive particles contained in the second region.

6. The semiconductor device according to claim 1, wherein in a bottom view, the first thermal conductive layer has a first side, a second side opposite to the second side and a third side extending between the first side and the second side, the electronic component has a fourth side and a fifth side connected with the fourth side, and wherein the first side is inwardly recessed compared to the fourth side, and the third side is inwardly recessed compared to the fifth side.

7. The semiconductor device according to claim 6, wherein in the bottom view, the electronic component has a sixth side opposite to the fourth side and a seventh side opposite to the fifth side, the first thermal conductive layer is surrounded by fourth side, fifth side, the sixth side and the seventh side of the electronic component.

8. The semiconductor device according to claim 1, wherein in a bottom view, the second thermal conductive layer is around the solderable element.

9. The semiconductor device according to claim 1, wherein the second thermal conductive layer comprises a first monolithic structure and a second monolithic structure separated from each other, a width of a first continuous interface between the first monolithic structure and the first thermal conductive layer is less than a width of a second continuous interface between the second monolithic structure and the first thermal conductive layer in a cross-sectional view.

10. The semiconductor device according to claim 1, wherein the second thermal conductive layer comprises a plurality of separated parts, and at least one of the plurality of separated parts has a thickness less than a thickness of the first thermal conductive layer.

* * * * *